United States Patent [19]

Garth

[11] Patent Number: 4,839,520

[45] Date of Patent: Jun. 13, 1989

[54] PRODUCTION OF PULSED ELECTRON BEAMS

[76] Inventor: Simon C. J. Garth, St. Johns College, St. Johns Street, Cambridge, United Kingdom, CB2 1TW

[21] Appl. No.: 100,012

[22] Filed: Sep. 23, 1987

[30] Foreign Application Priority Data

Oct. 3, 1986 [GB] United Kingdom ............... 8623842

[51] Int. Cl.$^4$ ............................................. H01J 37/147
[52] U.S. Cl. .................. 250/396 R; 250/398; 250/310; 324/158 D
[58] Field of Search ............ 250/396 R, 397, 398, 250/310; 350/319; 324/158 D

[56] References Cited

U.S. PATENT DOCUMENTS

| | | | |
|---|---|---|---|
| 4,127,049 | 11/1978 | Ichigaya | 84/1.18 |
| 4,439,685 | 3/1984 | Plies | 250/398 |
| 4,445,041 | 4/1984 | Kelly et al. | 250/505.1 |
| 4,626,690 | 12/1986 | Todokono et al. | 250/396 R |
| 4,721,909 | 1/1988 | Richardson | 250/396 R |

FOREIGN PATENT DOCUMENTS 0017846 1/1985 Japan ............................... 250/396 R Primary Examiner—Jack I. Berman
Attorney, Agent, or Firm—Lee & Smith

[57] ABSTRACT

Apparatus for producing a pulsed electron beam, particularly adapted for inspecting integrated circuits, includes a beam scanner (10) for causing a continuous electron beam to scan a circle, which beam may emerge from the second of three electrostatic lenses of an electron beam microscope. The beam then passes a deflecting means (12) on the circle for deflecting the beam in a radial direction at selected locations, before being collected by means (14) for collecting the electron pulses from alternate locations to provide a pulsed electron beam.

14 Claims, 4 Drawing Sheets

PRODUCTION OF PULSED ELECTRON BEAMS

FIELD OF THE INVENTION

This invention relates generally to pulsed electron beams and more especially to apparatus for producing pulsed electron beams, particularly beams containing very fast electron pulses with a high repetition rate.

BACKGROUND TO THE INVENTION

Electron beam testing techniques are becoming established as a means of measuring waveforms within operating integrated circuits (ICs). One area of application of electron beam testing technology is to the measurement of very high speed signals within ICs. One reason for this is that IC technology has so advanced that signals with many GHz bandwidth can be generated on a circuit. However, the electrical properties of IC packages make it very difficult to take this signal outside the chip. It is thus possible to design circuits which operate at high speeds internally but only communicate to the outside world at a much lower speed. Nevertheless, it is essential to have a means of measuring the ultra high frequency internal waveforms of a circuit in order to verify correct internal operation and to debug circuits which function incorrectly.

Traditionally, mechanical probes have been used to measure waveforms within circuits. However, as with the packages themselves, the electrical characteristics of the probes are such that very high speed signals cannot be measured. Electron beams have also been used to measure waveforms within circuits. The bandwidth of electron beam detection systems is fundamentally limited to relatively slow speeds (absolute maximum of a few MHz). Therefore, to make high speed measurements stroboscopic techniques must be used. This is generally achieved by pulsing the electron beam in synchronism with the circuit and integrating the collected signal.

With this last-mentioned technique, temporal resolution is limited by the speed with which the beam pulses can be switched and by the accuracy with which the pulses can be made to be incident at the same place in a waveform. In conventional beam pulsing systems, the electron beam is deflected electrostatically using a pulse generator so that, for a short period, the beam passes on down the axis but for the period outside the pulse time the beam is deflected on to an aperture where it is stopped. This system is limited by the speed of the pulse generator and the electron transit time through the blanking plates.

Higher speed signals are made possible in one known arrangement by scanning the electron beam across an aperture. A ramp signal is applied to the blanking plates but the beam is only positioned over the aperture for input voltages corresponding to a small section of the pulse risetime. Thus the pulses generated are a small fraction of the incoming blanking pulse risetime. However, it is then necessary to wait for the pulse to continue to its maximum height, return to a low level and rise again before the pulse can be repeated. This is a severe limitation in terms of both the jitter in the pulse and the amount of signal which can be recovered.

It is an object of this invention to provide improved means for generating a pulsed electron beam, in particular a pulsed electron beam containing very fast pulses at a high repetition rate enabling, for example, the investigation of operating ICs within which very high speed signals, possibly of many GHz bandwidth, are generated.

THE INVENTION

According to the invention, there is provided apparatus for producing a pulsed electron beam comprising:

scanning means for causing a continuous electron beam to scan a circle;

deflecting means arranged on the circle scanned by the electron beam and acting to deflect the beam in the radial direction at selected locations around the circle; and collecting means for collecting the electron pulses from alternate locations to provide a pulsed electron beam along an optical axis.

Preferably, an on-axis continuous beam is caused by the scanning means to scan a circle centred on the axis, the deflecting means acts at alternate locations around the circle respectively to deflect the beam towards the axis and to allow the beams to pass to an off-axis stop, and the deflected electron pulses are collected at an on-axis aperture and caused by the collecting means to form an on-axis pulsed beam.

The scanning means and the collecting means may each be constituted by a beam deflection device. Each such deflection device preferably comprises two pairs of orthogonally arranged electrostatic deflection plates, respectively driven with sinusoid and cosinusoid voltages having an appropriate phase shift which takes into account the electron beam transit time between the respective pairs of plates.

A preferred deflecting means arranged on the circle scanned by the beam comprises an array of electrostatic electrodes disposed around the circle. These electrodes carry preset voltages for effecting the required differential deflections of the beam as between the electrode locations and the intervening locations which are devoid of electrodes. All electrodes may or may not carry the same preset voltage. The preset voltage or voltages may possibly be changed between successive precessions of the beam around the circle, so that the beam responds to a different logical combination each time it passes around said circle. It is thus possible to control and adjust the pulse repetition rate in the emergent pulsed beam independently of the scanning frequency applied at the scanning means.

It will be appreciated that, if for example 100 electrodes are provided around the circle scanned by the beam, then if the beam precesses at a rate of 1 GHz, i.e. the scanning frequency is 1 GHz, a minimum beam pulse of 10 ps is obtainable. Thus, in general, when the apparatus is used for IC investigation, it is necessary only to be able to extract from the operating circuit a signal which is of the order of one hundredth of the fastest bandwidth to be probed by the electron beam, given that the scanning control signal is synchronised with the extracted signal. More generally, the apparatus provides means for providing a pulsed electron beam in an arbitrary pattern with a bandwidth of at least 50 GHz.

In practice, the apparatus will be combined with conventional electron beam optics which, in addition to the electron gun, includes one or more lenses for forming the continuous electron beam which is acted on by the scanning means and one or more lenses for focussing the pulsed beam on the sample, i.e. package, to be investigated. The scanning means and the collecting means of the apparatus according to this invention will then be located at the conjugate points of the optical system. If the apparatus is incorporated in an electron microscope, for example, the apparatus may be located interposed after the second lens.

A further feature of the invention concerns the structure of the deflecting means. This may be formed of a ceramic substrate having a circular aperture with deflecting electrodes disposed around its periphery and a single inner electrode on the axis of the circular aperture. The structure may be consolidated by four equiangularly spaced support wires squeezed between the core and the aperture in the substrate. Connection of the inner electrode to ground may be effected by means of one or more of the support wires. Circuit lines printed on the surface of the substrate provide for connection of preset voltages to the outer circle of electrodes, which are spaced from the inner electrode by the circular slit which is formed by the gap between the substrate aperture and the core. In use, the continuous electron beam is caused to scan the circular slit, and the electrons pass through said slit with the required differential deflections.

The circuit printed on the board may include a plurality of shift registers which are successively clocked each to provide the appropriate preset voltages on parallel outputs to an arc of the circular array of electrodes.

Finally, the drive circuit for the scanning means and the collecting means, each in the form of two pairs of orthogonally arranged deflecting plates, may comprise a signal generator, for example synchronised by an input signal extracted from an operating IC circuit under test, a signal splitter fed with the signal generator output and having four output channels, and four output lines each including a phase modulator, these four output lines providing respective drive signals to the four deflecting plates each with the required phase shift.

DESCRIPTION OF DRAWINGS

Apparatus for producing a pulsed electron beam in accordance with the invention will now be exemplified by the following description which makes reference to the accompanying drawings, in which.

DESCRIPTION OF EMBODIMENT

Figure 1:
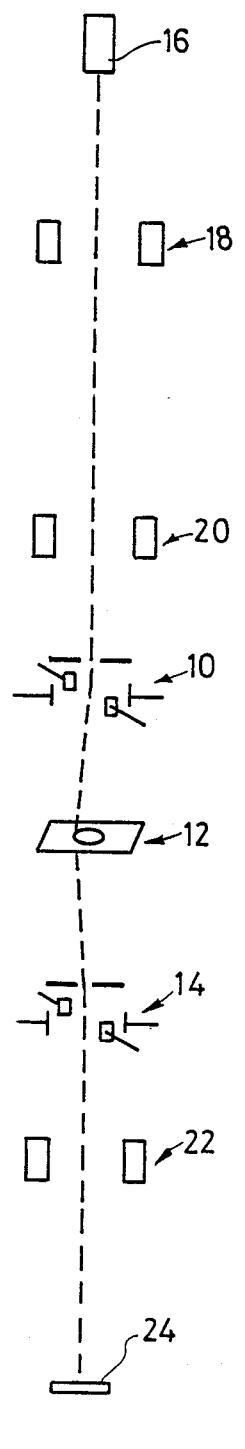
FIG. 1 shows the apparatus diagrammatically, when incorporated in an electron microscope.

Referring first to FIG. 1, the apparatus in accordance with the invention comprises the three devices 10, 12 and 14, when incorporated in the optical system of an electron microscope, for example a Cambridge Instruments S-200 scanning electron microscope. The microscope includes, in addition to the electron gun 16, first, second and third electrostatic lenses 18, 20 and 22. Reference 24 denotes a sample under test. Typically lens 20 focuses the beam at 12 (i.e. the conjugate point of lens 22).

Figure 2:
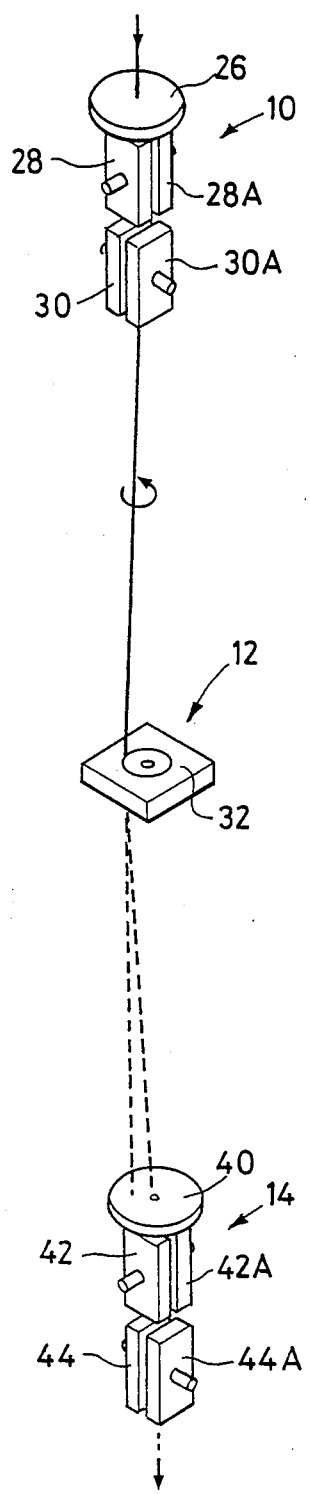
FIG. 2 shows the apparatus in more detail.

Turning now to FIG. 2, the apparatus of the invention comprises a beam scanner 10, a beam deflector 12 and a beam collector 14. The continuous electron beam emergent from the second lens 20 of the microscope passes through a beam-defining apertured plate 26 to the beam scanner 10, which comprises two pairs of orthogonal electrostatic deflection plates 28, 28A and 30, 30A. These plates are driven with sinusoid and cosinusoid voltages, respectively with an appropriate phase shift to account for the electron beam transit time through the plates, which typically may be 53 ps/mm at 1 KeV. The beam is thus scanned in a circle.

It can be shown that the beam will always be scanned in a circle, irrespective of the length of the deflection plates and the transit time of the electron beam. The beam will, however, be displaced from the optical axis out of phase with the electron velocity. This can readily be corrected by use of an analytic algorithm, which is applied at the pulse generator shown in FIG. 5, described later. The frequency of precession of the beam around the circle is determined solely by the pulse generator, and a typical frequency may be in the range 0 to 1 GHz.

The beam is scanned around the beam deflector 12, which comprises a blanking electrode 32 having an array of blanking electrodes, typically about 100, arranged in a circle.

Figure 3A:
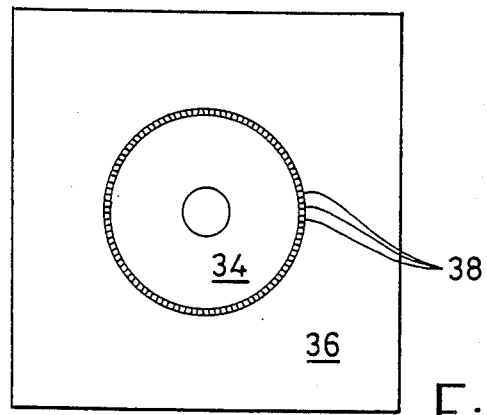
FIGS. 3A, 3B and 3C show an electron beam deflection device.
Figure 3B:
Figure 3C:
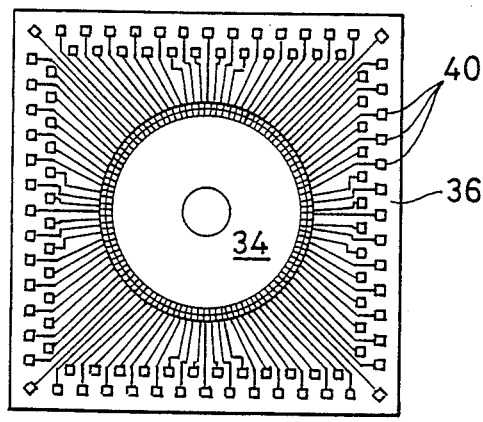

One embodiment of blanking electrode 32 is shown in FIGS. 3A, 3B and 3C, showing the electrode from the top, from the side and from underneath, respectively. It comprises an inner electrode 34 connected to ground, this electrode being in the form of a cylindrical core which forms a unified structure with a surrounding apertured ceramic substrate 36 which carries the blanking electrodes 38 around its inner periphery facing the ground inner electrode 34 and spaced therefrom by a narrow circular slit. The electron beam is scanned around said slit.

The blanking electrodes 38 are preset to voltages such that the beam passes through the slit either with deflection back on to the optical axis or with deflection to waste or absorption. In most applications, the blanking electrodes 38 will be set at the same voltage levels for many transits of the beam. However, each such electrode has the time of electron beam precession around the circular slit in which to change state, e.g. 1 ns or longer, so that it is alternatively possible dynamically to change the plate voltages, essentially in parallel, so that the beam responds to a different logical combination of deflection voltages each time it passes around the slit. The pattern of electron pulse repetition can thus be varied. In a typical case, with a precession rate of 1 GHz and 100 blanking electrodes, the minimum beam pulse is 10 ps.

The preset voltages are applied to the blanking electrodes 38 on the circuit paths 40 printed on the substrate 36. The electrodes 38 themselves are preferably formed by a 1 micron layer of gold, deposited by photoresist techniques.

The beam pulses deflected on to the optical axis are received through a beam-defining apertured plate 40 to the beam collector 14 which collects the pulses to straighten them into a pulsed electron beam passing along the optical axis towards the sample. The collector 14 comprises two pairs of orthogonally arranged deflecting plates 42, 42A and 44, 44A arranged in the same manner as the beam scanner and driven by appropriate phase-shifted sinusoidal and cosinusoidal voltages. These phase shifts allow for the electron beam transit time through the system, which is fractionally longer than in the basic electron microscope owing to the slightly increased path length. However, the path length is the same for all the electron pulses so that no timing error arises. The electron optics of the original microscope can remain unaltered and the final pulsed beam will enter the third lens on axis and with virtually the same divergence as in the basic instrument. This instrument therefore remains usable in its original mode simply by switching off the apparatus of the invention, which apparatus does not have to be removed. However, it will be understood that it is not essential for the invention to be practised in the form of apparatus incorporated into an electron microscope.

A typical blanking plate structure is 2 mm thick, with a generally square substrate of 25 mm side length apertured to form a narrow circular slit, approximately 0.1 mm width, around a cylindrical core (ground electrode) of 3 mm outer diameter.

Figure 4:
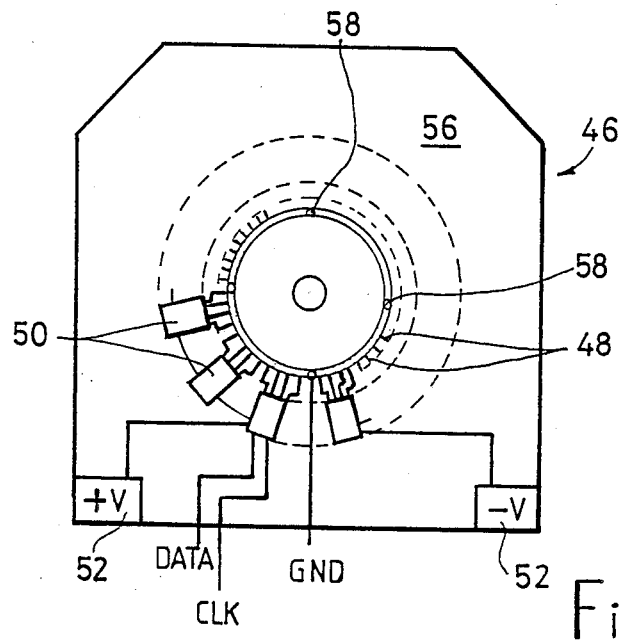
FIG. 4 shows a modified deflection device.

FIG. 4 diagrammatically illustrates a modified blanking electrode 46 wherein the blanking electrodes 48 are driven from a series of shift registers 50 driven by clock and data inputs, the preset voltages being applied to the electrodes through the registers from power supply pads 52.

FIG. 4 also serves to show the manner in which the inner core 54 and the substrate 56 are consolidated, using four equi-angularly spaced support wires 58. The core is shrunk and the four support wires are heated and positioned around the core, which latter is then located within the substrate aperture. The plug is then heated and the support wires cooled so that differential expansion effects cause the support wires to be squeezed and bedded into position to consolidate the overall structure. The four substrate electrodes at the support wire positions may be omitted, and one or more of the support wires may be utilised for grounding the inner electrode.

Figure 5:
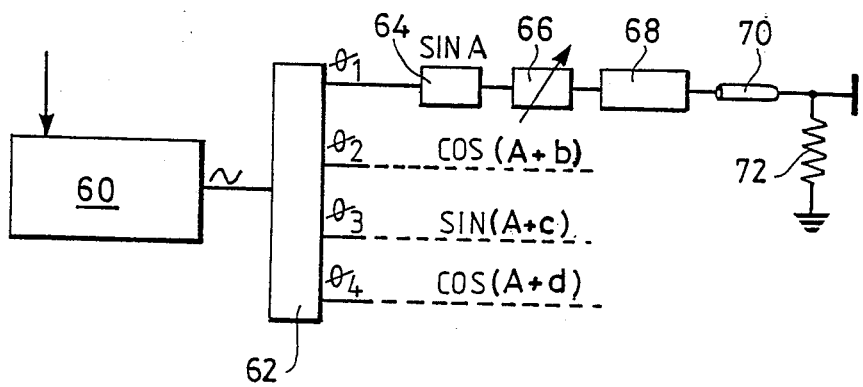
FIG. 5 is a block circuit diagram.

Finally, FIG. 5 shows a drive circuit for the beam scanner 10 and the beam collector 14. A synchronising signal generator 60, fed with an input signal extracted from IC package under test, outputs a sinusoidal signal, say of frequency 1 GHz, to a splitter 62 which has four output channels. Each output channel comprises a phase modulator 64 followed by an adjustable attenuator 66 and a fixed gain amplifier 68 (necessary in view of the high frequency signal being handled) and a coaxial cable 70 leading to one of the deflector plates 28, the required applied voltage being developed across a 50 ohm output resistance 72. The respective phase modulators provide outputs sin A, cos (A+b), sin (A+c) and cos (A+d), as required to drive the deflector plates with the requisite phase shifts having regard to electron beam transit times. The electrode beam is pulsed at a rate which is substantially 100 times the frequency of the signal extracted from the IC package and may therefore be used, for example, to investigate signals on board the package of up to 50 GHz or more, being signals of such high frequency that direct communication with the outside world is not feasible. More generally, an IC chip under test is required only to produce a signal which is typically one hundredth of the bandwidth of the fastest signal in the chip circuit.

In practice, the apparatus of the invention is limited only by the frequency of precession at the array of blanking electrodes and by the spread in electron velocities caused by the energy spread of the electrons, which tends to blur the edges of very fast pulses.

It will be appreciated that the embodiment described with reference to the drawings may be modified in various ways within the scope of the invention hereinbefore defined.

I claim:

1. Apparatus for producing a pulsed electron beam comprising:
    scanning means for causing a continuous electron beam to scan a circle;
    deflecting means comprising an array of electrostatic electrodes disposed around the circle scanned by the electron beam and acting to reflect the beam in a radial direction at selected locations around the circle, thereby creating electron pulses and
    collecting means for collecting electron pulses from alternate locations to provide a pulsed electron beam along an optical axis.

2. Apparatus as claimed in claim 1, further comprising means for centering the circle scanned by the continuous electron beam on the axis of said beam and an off-axis stop and an on-axis aperture, wherein the deflecting means acts at alternate locations around the circle respectively to deflect the beam towards the axis and to allow the beam to pass to said off-axis stop, and the deflected electron pulses are collected at said on-axis aperture and caused by the collecting means to form an on-axis pulsed beam.

3. Apparatus as claimed in claim 1 wherein the scanning means and the collecting means are each constituted by a beam deflection device.

4. Apparatus as claimed in claim 3 wherein each such deflection device comprises pairs of orthogonally arranged electrostatic deflection plates, means for respectively driving said deflection plates with sinusoid and cosinusoid voltages having an appropriate phase shift which takes into account the electron beam transit time between the respective pairs of plates.

5. Apparatus as claimed in claim 1 further comprising intervening locations between said electrodes and means for providing preset voltage to said electrodes for effecting the required differential deflections of the beam as between the electrode locations and the intervening locations which are devoid of electrodes.

6. Apparatus as claimed in claim 5 wherein the electrodes carry the same preset voltage.

7. Apparatus as claimed in claim 5 further comprising means for changing said preset voltages between successive precessions of the beam around the circle, so that the beam responds to a different pattern of deflection voltages each time it passes around the circle.

8. Apparatus as claimed in claim 7 further including means for controlling and adjusting a pulse repetition rate independently of the scanning frequency at the scanning means.

9. Apparatus as claimed in claim 1 wherein the deflecting means comprises a ceramic substrate having a circular aperture with deflecting electrodes disposed around its periphery and a single inner electrode on the axis of the circular aperture.

10. Apparatus as claimed in claim 1 further comprising an integrated circuit and power supply means for operating said circuit, and wherein the scanning means and the collecting means each comprise pairs of orthogonally arranged deflecting plates, and further comprising a drive circuit for driving the scanning means and the collecting means, wherein said drive means comprises a signal generator, a signal splitter fed with the signal generator output and having four output channels, and four output lines each including a phase modulator, the four output lines providing respective drive signals to the four deflecting plates each with the required phase shift.

11. Apparatus as claimed in claim 10 further comprising means for synchronizing the signal generator by a input signal extracted from the integrated circuit under test.

12. An electron beam optical system comprising an electron gun, one or more lenses for forming a continuous electron beam, and one or more lenses for focusing a pulsed electron beam, and further including a means for producing said pulsed electron beam comprising:

scanning means for causing a continuous electron beam to scan a circle;

deflecting means comprising an array of electrostatic electrodes disposed around the circle scanned by the electron beam and acting to deflect the beam in a radial direction at selected locations around the circle, thereby creating electron pulses. and, collecting means for collecting electron pulses from alternate locations to provide a pulsed electron beam along an optical axis.

13. A system as claimed in claim 12 in which the scanning means and the collecting means of the apparatus are located at conjugate points of the electron beam optical system.

14. Apparatus for producing a pulsed electron beam comprising:

scanning means for causing a continuous electron beam to scan a circle;

deflecting means arranged on the circle scanned by the electron beam and acting to deflect the beam in a radial direction at selected locations around the circle, thereby creating electron pulses.

collecting means for collecting the electron pulses from alternate locations to provide a pulsed electron beam along an optical axis;

wherein the deflecting means comprises an array of electrostatic electrodes disposed around the circle, intervening locations between said electrodes, and means for providing preset voltages to said electrodes for effecting the required differential deflections of the beam as between the electrode locations and the intervening locations which are devoid of electrode; and an off-axis stop and an on-axis aperture, wherein an on-axis continuous beam is caused by said scanning means to scan a circle centered on said axis, and wherein said deflecting means acts at said intervening locations around said circle respectively to deflect the beam towards said axis and to allow the beam to pass to said off-axis stop, and the deflected electron pulses are collected at said on-axis aperture and caused by said collecting means to form an on-axis pulsed beam.

* * * * *